(12) United States Patent
Cha et al.

(10) Patent No.: US 10,331,217 B2
(45) Date of Patent: Jun. 25, 2019

(54) ACTUATOR

(71) Applicants: KOREA INSTITUTE OF SCIENCE AND TECHNOLOGY, Seoul (KR); CENTER OF HUMAN-CENTERED INTERACTION FOR COEXISTENCE, Seoul (KR)

(72) Inventors: Youngsu Cha, Seoul (KR); Kahye Song, Seoul (KR); Jung Min Park, Seoul (KR); Bum-Jae You, Seoul (KR)

(73) Assignees: Korea Institute of Science and Technology, Seoul (KR); Center of Human-Centered Interaction for Coexistence, Seoul (KR)

( * ) Notice: Subject to any disclaimer, the term of this patent is extended or adjusted under 35 U.S.C. 154(b) by 0 days.

(21) Appl. No.: 15/920,378

(22) Filed: Mar. 13, 2018

(65) Prior Publication Data
US 2019/0121434 A1    Apr. 25, 2019

(30) Foreign Application Priority Data

Oct. 19, 2017    (KR) .................. 10-2017-0135575

(51) Int. Cl.
*B81B 3/00*    (2006.01)
*G06F 3/01*    (2006.01)

(52) U.S. Cl.
CPC ............ *G06F 3/016* (2013.01); *B81B 3/0021* (2013.01); *B81B 2201/034* (2013.01);
(Continued)

(58) Field of Classification Search
CPC . G06F 3/016; B81B 3/0021; B81B 2201/034; B81B 2203/0181; B81B 2203/058; B81B 2203/06
(Continued)

(56) References Cited

U.S. PATENT DOCUMENTS

2005/0001701 A1    1/2005    Shirakawa
2009/0268270 A1*  10/2009    Keyworth ............. B81B 3/0086
                                                        359/226.1

(Continued)

FOREIGN PATENT DOCUMENTS

JP    2005-022036 A    1/2005
JP    2007-188005 A    7/2007
(Continued)

OTHER PUBLICATIONS

Jongseok Kim et al., "Variable Pivot Seesaw Actuated RF Mems Switch for Reconfigurable System Application", MEMS 2007, Jan. 21-25, 2007, pp. 775-778.

*Primary Examiner* — Kerri L McNally
(74) *Attorney, Agent, or Firm* — Rabin & Berdo, P.C.

(57) ABSTRACT

Disclosed is an actuator including a support member, an actuating unit rotatably installed in the support member and having a first electrode installed on one side and a stimulation providing unit installed on the other side to provide stimulation by rotation, and an attraction force providing unit having a second electrode to provide an attraction force to the first electrode, wherein when an electrostatic attraction force is provided to the first electrode through the second electrode, the actuating unit pivots to enable the stimulation providing unit to apply stimulation to a sensing unit.

7 Claims, 4 Drawing Sheets

(52) U.S. Cl.
CPC . *B81B 2203/0181* (2013.01); *B81B 2203/058* (2013.01); *B81B 2203/06* (2013.01)

(58) Field of Classification Search
USPC ..................................................... 340/407.2
See application file for complete search history.

(56) References Cited

U.S. PATENT DOCUMENTS

| | | |
|---|---|---|
| 2011/0273975 A1 | 11/2011 | Cheng et al. |
| 2014/0002948 A1 | 1/2014 | Yoon et al. |
| 2014/0191973 A1* | 7/2014 | Zellers .................. G06F 3/0414 |
| | | 345/168 |
| 2014/0320276 A1* | 10/2014 | Maschmeyer .......... G06F 3/016 |
| | | 340/407.2 |
| 2019/0019644 A1* | 1/2019 | Lee ...................... H01H 50/005 |

FOREIGN PATENT DOCUMENTS

| | | |
|---|---|---|
| KR | 10-2002-0042301 A | 6/2002 |
| KR | 10-2014-0001398 A | 1/2014 |

\* cited by examiner

ACTUATOR

CROSS-REFERENCE TO RELATED APPLICATION

This application claims priority to Korean Patent Application No. 10-2017-0135575, filed on Oct. 19, 2017, and all the benefits accruing therefrom under 35 U.S.C. § 119, the contents of which in its entirety are herein incorporated by reference.

BACKGROUND

1. Field

The present disclosure relates to an actuator, and more particularly, to an actuator that rotates by an electrostatic attraction force to enable application of stimulation to a target.

DESCRIPTION OF GOVERNMENT-SPONSORED RESEARCH AND DEVELOPMENT

This research is sponsored by Global Frontier project (Development of hand-based Seamless CoUI technology for collaboration among remote users, Project No. 1711052648) of National Research Foundation of Korea, Ministry of Science and ICT, under the supervision of Korea Institute of Science and Technology.

2. Description of the Related Art

Haptics is tactile and force feedback technology that takes the benefits of a user's sense of touch by applying haptic feedback such as forces, vibrations and motions to the user. Additionally, kinesthetic feedback and tactile feedback are known collectively as haptic feedback. The haptic feedback are useful for providing cues to alert the user of specific events or to provide realistic feedback sensations to create a greater sensory experience.

To generate haptic feedback, some types of haptic actuators can be utilized. Examples of known haptic actuators include an electromagnetic actuator such as an Eccentric Rotating Mass ("ERM") in which an eccentric mass is moved by a motor, a Linear Resonant Actuator ("LRA") in which a mass attached to a spring is driven back and forth, a "smart material" such as piezoelectric material, electroactive polymers, or shape memory alloys, etc. Many of these actuators and the devices with which they interact typically have resonant frequencies, which can be built in or dynamically determined. Drive signals can be applied to the actuators to generate the haptic force feedback effectively and efficiently.

Additionally, devices including mobile devices, touchscreen devices, touchpad devices and personal computers may be configured to generate haptic feedback. For example, when a user interacts with a device using a button, a touchscreen, a touchpad, a lever, a joystick wheel, or any other controller, the device's OS may transmit operation commands through a control circuit in embedded hardware. Afterward, the embedded hardware generates a suitable haptic feedback.

In the case of conventional haptic actuators such as earlier patent literature (US 20050001701 A1), an actuator is disclosed in which the degree of tilt of beams may be adjusted using an electrostatic force and the position and number of substrate contact points are free. In the case of conventional haptic actuators, the structure is complex because a plurality of beams should be installed to make a plurality of contact points and more contacts should be made.

Therefore, there is a demand for development of an actuator with a simpler structure for delivering sufficient stimulation to a target.

SUMMARY

The present disclosure is directed to providing an actuator with a simple structure for applying stimulation to a target.

The present disclosure is further directed to providing an actuator that pivotably moves by an electrostatic attraction force.

To achieve the object, an actuator of the present disclosure includes a support member, an actuating unit rotatably installed in the support member and having a first electrode installed on one side and a stimulation providing unit installed on the other side to provide stimulation by rotation, and an attraction force providing unit having a second electrode to provide an attraction force to the first electrode, wherein when an electrostatic attraction force is provided to the first electrode through the second electrode, the actuating unit pivots to enable the stimulation providing unit to apply stimulation to a sensing unit.

According to an embodiment in relation to the present disclosure, the actuating unit includes a first part having the first electrode installed on one surface, and a second part extending such that the second part intersects with the first part, and having the stimulation providing unit at an end.

The actuating unit may further include a rotary shaft extending in a direction that intersects with each extension direction of the first and second parts at an intersection of the first and second parts, and the rotary shaft may be installed in the support member to allow the first and second parts to pivot.

According to another embodiment in relation to the present disclosure, the stimulation providing unit is formed in a hemispherical shape to apply stimulation to the sensing unit.

The support member may include a pair of members spaced apart from each other, and the actuating unit may further include a pair of rotary shafts each installed rotatably with respect to the pair of support members.

The rotary shafts may extend in a direction that intersects with each extension direction of the first and second parts at an intersection of the first and second parts.

According to still another embodiment in relation to the present disclosure, voltage of different polarities is applied to the first and second electrodes to generate an electrostatic attraction force between the first and second electrodes.

DETAILED DESCRIPTION

Figure 1:
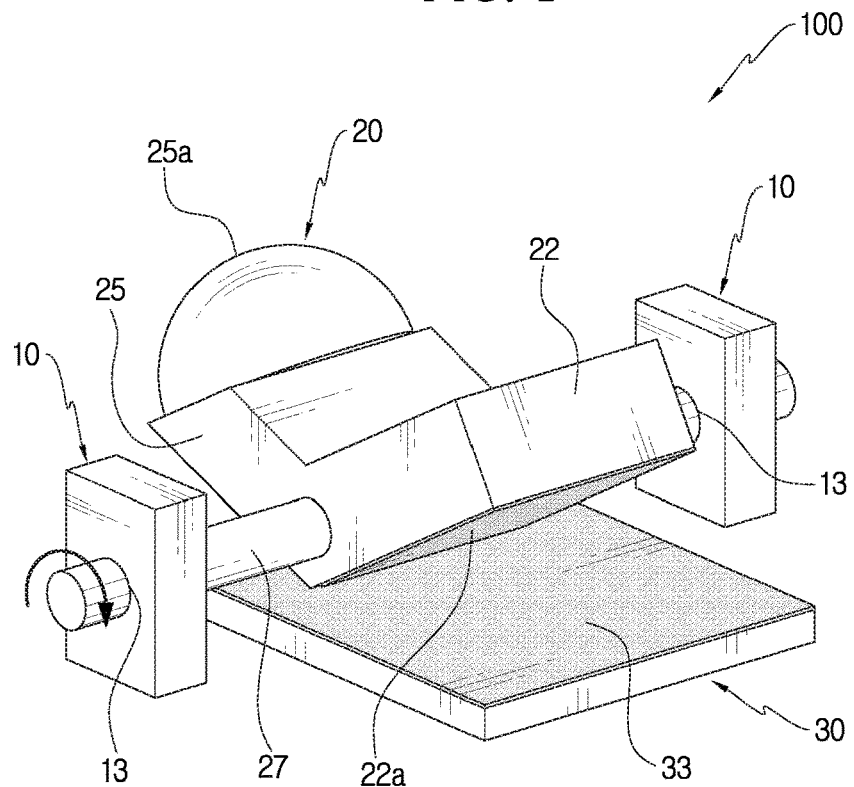
FIG. 1 is a perspective view showing an example of an actuator of the present disclosure.

Hereinafter, the embodiments disclosed herein will be described in detail with reference to the accompanying drawings, in which identical or similar reference numerals are given to identical or similar elements, and an overlapping description is omitted herein. The suffix "unit" as used herein refers to elements or components, and it is only given or interchanged in consideration of facilitation of the description, and does not itself have any distinguishable meaning or role. Furthermore, in describing the embodiments disclosed herein, when a certain description of related well-known technology is deemed to render the essential subject matter of the embodiments disclosed herein ambiguous, its detailed description is omitted herein. It should be further understood that the accompanying drawings are only provided to facilitate the understanding of the embodiments disclosed herein, and the technical spirit disclosed herein is not limited by the accompanying drawings and covers all modifications, equivalents or substituents included in the spirit and technical scope of the present disclosure.

The terms including the ordinal number such as "first", "second" and the like may be used to describe various elements, but the elements are not limited by the terms. The terms are only used to distinguish one element from another.

It will be understood that when an element is referred to as being "connected to" another element, it can be directly connected to the other element or intervening elements may be present.

As used herein, the singular forms are intended to include the plural forms as well, unless the context clearly indicates otherwise.

It will be further understood that the terms "comprises" or "includes" when used in this specification, specify the presence of stated features, integers, steps, operations, elements, components or groups thereof, but do not preclude the presence or addition of one or more other features, integers, steps, operations, elements, components, or groups thereof.

FIG. 1 is a perspective view showing an example of an actuator 100 of the present disclosure.

Referring to FIG. 1, the actuator 100 of the present disclosure includes a support member 10, an actuating unit 20, and an attraction force providing unit 30.

The actuator 100 of the present disclosure may be a haptic actuator.

The support member 10 rotatably supports the actuating unit 20. For example, the support member 10 may be a pair of plates spaced apart from each other, and when the support member 10 is a pair of plates, each support member 10 preferably has a proper thickness for rotatably supporting the actuating unit 20.

The support member 10 may have a hole 13 into which a rotary shaft 27 as described below can be inserted.

The actuating unit 20 is rotatably installed in the support member 10, and has a first electrode 22a and a stimulation providing unit 25a. The first electrode 22a is installed on one side of the actuating unit 20, and the stimulation providing unit 25a is installed on the other side of the actuating unit 20, and applies stimulation to a sensing unit 50 when the actuating unit 20 rotates.

The actuating unit 20 may include a first part 22, a second part 25, and a rotary shaft 27.

The first electrode 22a may be installed on one surface of the first part 22. The stimulation providing unit 25a may be provided at the end of the second part 25. The first part 22 and the second part 25 may extend such that they intersect each other, and for example, the first and second parts 22, 25 may be in the shape of letter V, forming an angle of 90 degrees or more therebetween.

Figure 2A:
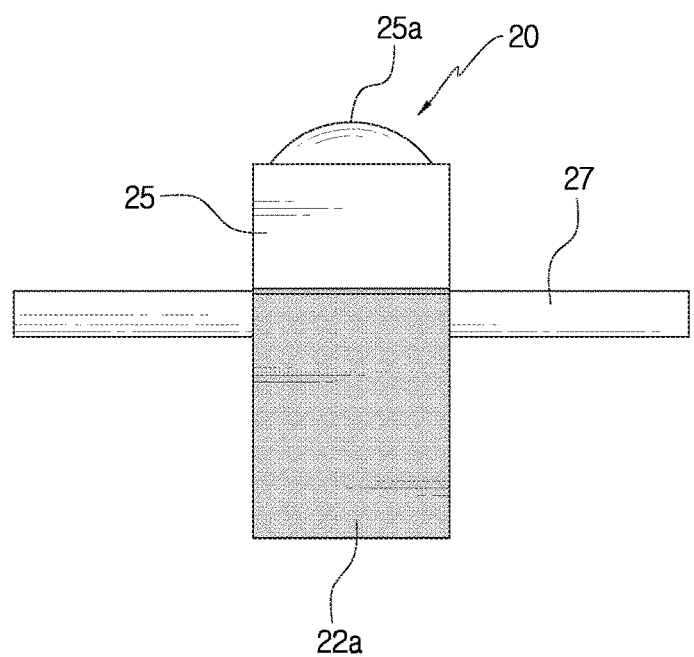
FIG. 2A is a bottom view of an actuating unit of the actuator of FIG. 1.
Figure 2B:
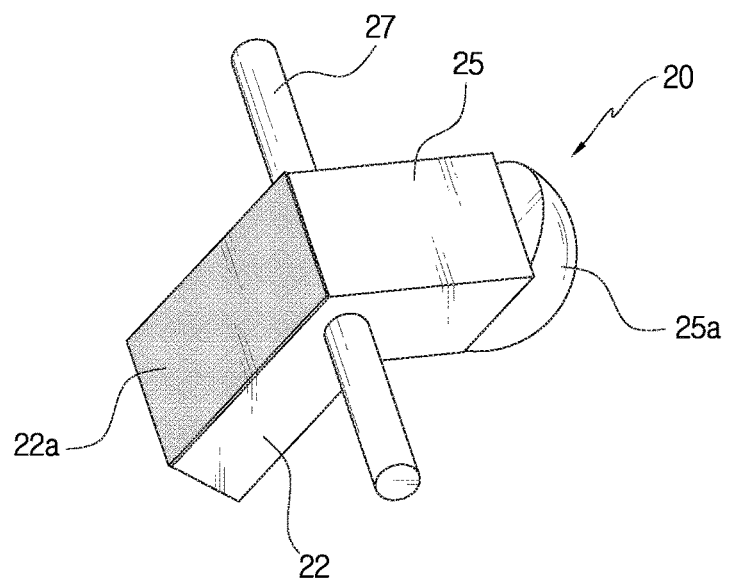
FIG. 2B is a perspective view of an actuating unit of the actuator of FIG. 1.
Figure 2C:
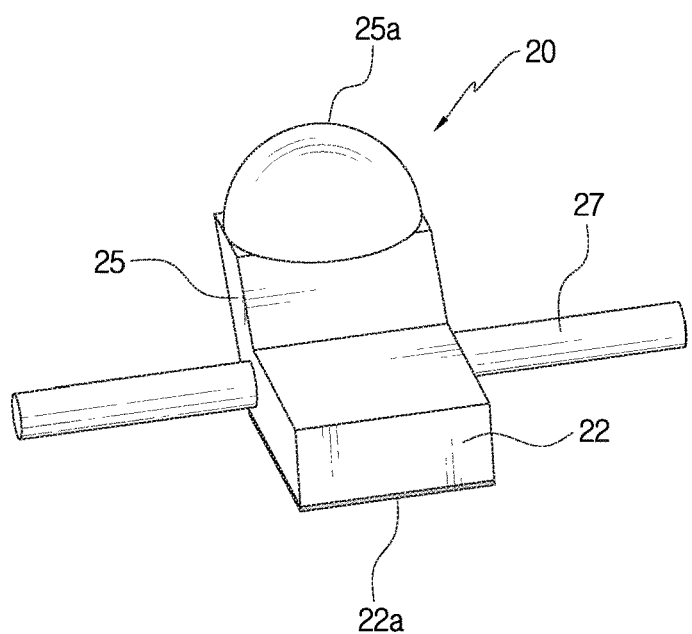
FIG. 2C is a front view of an actuating unit of the actuator of FIG. 1.

FIGS. 1 to 2C show an example of the actuating unit 20 having the first and second parts 22, 25 that intersect each other at about 90 degrees or more, and the first electrode 22a installed on the lower surface of the first part 22. Additionally, the example shows that the stimulation providing unit 25a is formed at the end of the second part 25 on the opposite side to the side where the first part 22 is placed.

The rotary shaft 27 is inserted into the hole 13 of the support member 10 rotatably with respect to the support member 10 to allow the first and second parts 22, 25 to pivot. The rotary shaft 27 may extend in a direction that intersects with an extension direction of the first and second parts 22, 25 at the intersection of the first and second parts 22, 25. Additionally, a pair of rotary shafts may be each installed in the pair of support members. FIGS. 1 to 2C show an example in which the rotary shaft is installed at the intersection of the first and second parts 22, 25 for each of the pair of support members.

The attraction force providing unit 30 has a second electrode 33 to provide an attraction force to the first electrode 22a. The second electrode 33 may be placed adjacent to the first electrode 22a. The actuating unit 20 may rotate with respect to the support member 10 by the attraction force between the first and second electrodes 22a, 33, and the stimulation providing unit 25a may apply stimulation by pressing the sensing unit 50.

Voltage may be applied to each of the first and second electrodes 22a, 33. The first and second electrodes 22a, 33 are preferably opposite in polarity so that an attraction force acts between them when voltage is applied. For example, the first electrode 22a may be positive (+), and the second electrode 33 may be negative (−).

Figure 3A:
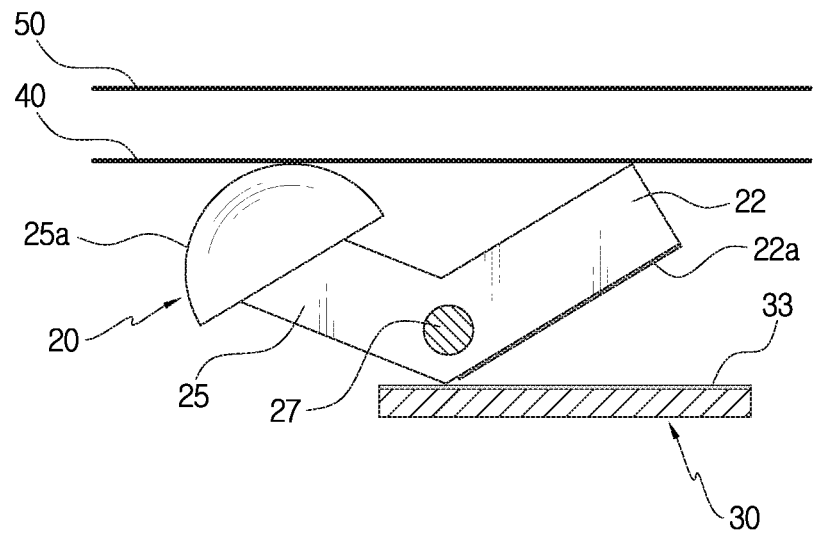
FIG. 3A is a conceptual diagram showing the condition before an attraction force acts on an actuating unit of the present disclosure.
Figure 3B:
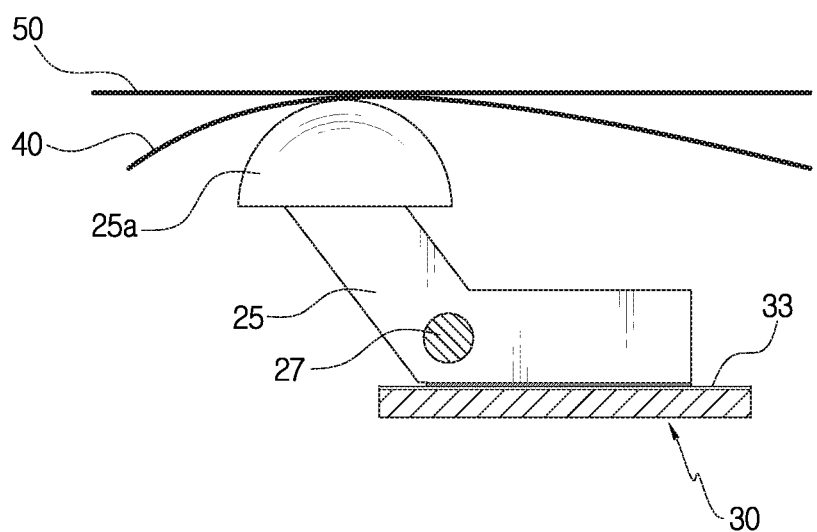
FIG. 3B is a conceptual diagram showing an example in which stimulation is applied to a sensing unit by an attraction force acting on an actuating unit of the present disclosure.

The actuator 100 of the present disclosure may further include a cover unit 40 to cover the stimulation providing unit 25a when the actuating unit 20 pivots and the stimulation providing unit 25a presses the sensing unit 50. The cover unit 40 is spaced apart from the sensing unit 50 before stimulation is provided as shown in FIG. 3A, and in the event that stimulation is provided as shown in FIG. 3B, the cover unit 40 may be configured to cover the stimulation providing unit 25a and apply stimulation to the sensing unit 50.

In the actuator 100 of the present disclosure, when the first and second electrodes 22a, 33 are subjected to an attraction force by an electrostatic attraction force between them, the actuating unit 20 pivots and the stimulation providing unit 25a applies stimulation to the sensing unit 50. Because the actuating unit 20 has the first electrode 22a installed on one surface of the first part 22 and the stimulation providing unit 25a formed at the end of the second part 25, when an attraction force acts between the first electrode 22a and the second electrode 33, the stimulation providing unit 25a may pivot upward and apply stimulation to the sensing unit 50.

Figure 4:
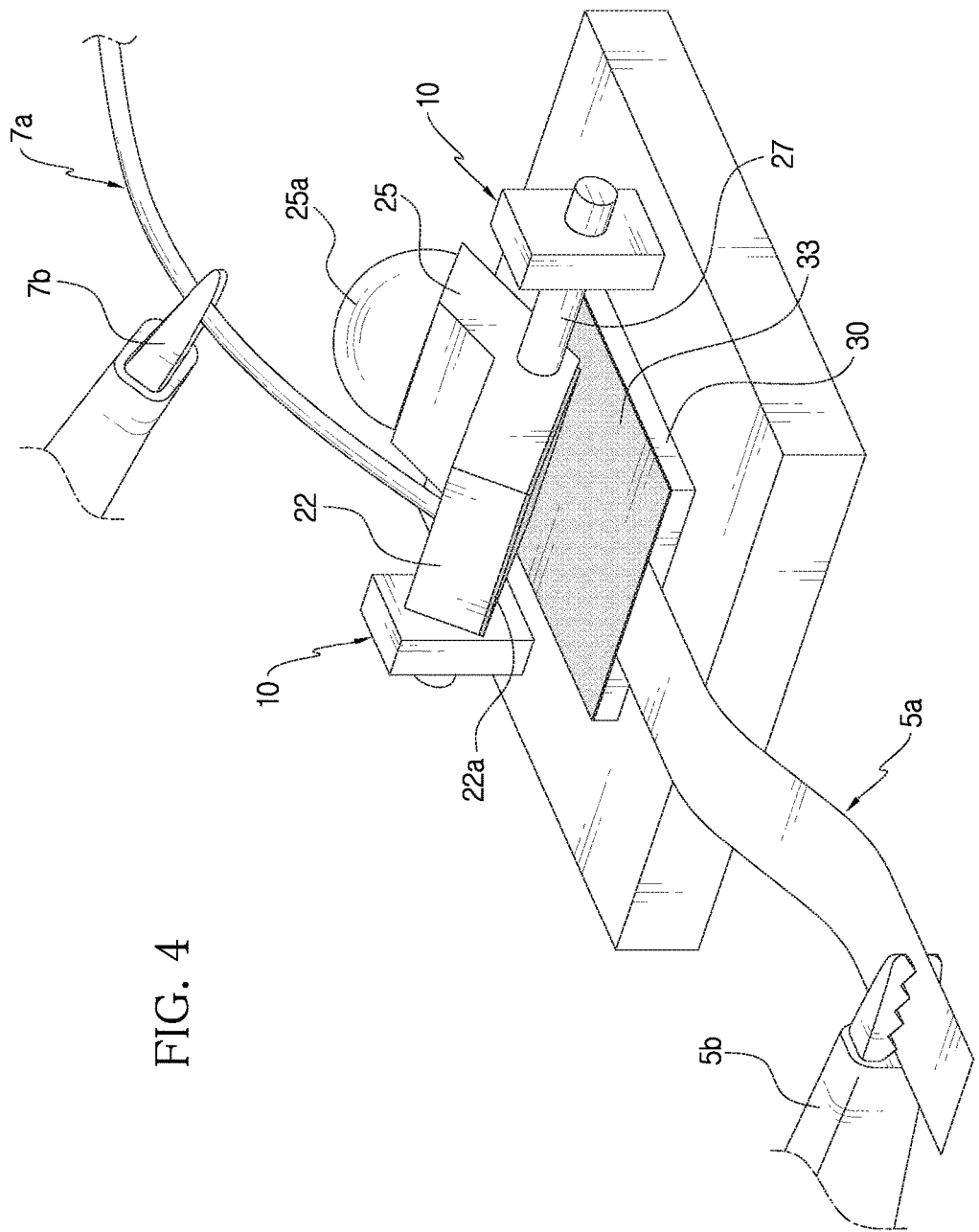
FIG. 4 is a conceptual diagram showing an example in which voltage is applied to an actuator of the present disclosure.

FIG. 4 is a conceptual diagram showing an example in which voltage is applied to the actuator 100 of the present disclosure. In FIG. 4, the first electrode 22a is electrically connected to a first conductor 7a, the second electrode 33 is electrically connected to a second conductor 5a, the first conductor 7a is electrically connected to a first electrical wire with alligator clamp 7b, and the second conductor 5a is electrically connected to a second electrical wire with alligator clamp 5b. Additionally, although not clearly shown in FIG. 4, the first electrical wire with alligator clamp 7b and the second electrical wire with alligator clamp 5b are each electrically connected to a power supply unit (not shown). When power is supplied through the power supply unit, the first electrode 22a generates an electrostatic attraction force with the second electrode 33 so that the actuating unit 20 may pivot and the stimulation providing unit 25a may press the sensing unit 50.

The actuator 100 of the present disclosure can be applied to vibration generation and tactile feedback devices. Additionally, the actuator 100 of the present disclosure can be used for ultramicro actuation applications requiring a strong force, for example, such as a Micro Electro Mechanical Systems (MEMS) microvalve or an optical pick-up head actuator 100.

The actuator of the present disclosure may be configured such that the actuating unit pivots by an electrostatic attraction force between the first and second electrodes and the stimulation providing unit applies stimulation to the sensing unit.

Additionally, the actuator of the present disclosure may be configured such that the first and second parts intersecting each other are rotatably coupled to the support member, and when an electrostatic attraction force is generated on one side of the first part, the stimulation providing unit may apply stimulation to the sensing unit.

Meanwhile, the actuator of the present disclosure has a simple structure including the support member, the actuating unit and the attraction force providing unit, and can effectively apply stimulation to a target.

The actuator 100 as described above is not limited to the configuration and method of the embodiments described above, and some or all of the embodiments may be selectively combined to make various modifications thereto.

It is obvious to those skilled in the art that the present disclosure may be embodied in any other specific form without departing from the spirit and essential feature of the present disclosure. Therefore, it should be noted that the detailed description is for illustration only, but not intended to limiting in all aspects. The scope of the present disclosure should be determined by the reasonable interpretation of the appended claims, and the scope of the present disclosure covers all modifications made within the equivalent scope of the present disclosure.

What is claimed is:

1. An actuator comprising:
a support member;
an actuating unit rotatably installed in the support member, and having a first electrode installed on one side and a stimulation providing unit installed on the other side to provide stimulation by rotation; and
an attraction force providing unit having a second electrode to provide an attraction force to the first electrode,
wherein when an electrostatic attraction force is provided to the first electrode through the second electrode, the actuating unit pivots to enable the stimulation providing unit to apply stimulation to a sensing unit.

2. The actuator according to claim 1, wherein the actuating unit includes:
a first part having the first electrode installed on one surface; and
a second part extending such that the second part intersects with the first part, and having the stimulation providing unit at an end.

3. The actuator according to claim 2, wherein the actuating unit further includes a rotary shaft extending in a direction that intersects with each extension direction of the first and second parts at an intersection of the first and second parts, and the rotary shaft is installed in the support member to allow the first and second parts to pivot.

4. The actuator according to claim 1, wherein the stimulation providing unit is formed in a hemispherical shape to apply stimulation to the sensing unit.

5. The actuator according to claim 2, wherein the support member includes a pair of members spaced apart from each other, and
the actuating unit further includes a pair of rotary shafts each installed rotatably with respect to the pair of support members.

6. The actuator according to claim 5, wherein the rotary shafts extend in a direction that intersects with each extension direction of the first and second parts at an intersection of the first and second parts.

7. The actuator according to claim 1, wherein voltage of different polarities is applied to the first and second electrodes to generate an electrostatic attraction force between the first and second electrodes.

* * * * *